(12) United States Patent
Nishioka et al.

(10) Patent No.: US 11,345,533 B2
(45) Date of Patent: May 31, 2022

(54) SPUTTERING TARGET PACKAGING STRUCTURE AND METHOD OF PACKAGING SPUTTERING TARGET

(71) Applicant: SUMITOMO CHEMICAL COMPANY, LIMITED, Tokyo (JP)

(72) Inventors: Koji Nishioka, Osaka (JP); Naoya Satoh, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 150 days.

(21) Appl. No.: 16/694,618

(22) Filed: Nov. 25, 2019

(65) Prior Publication Data

US 2020/0165050 A1 May 28, 2020

(30) Foreign Application Priority Data

Nov. 26, 2018 (JP) .............................. JP2018-219946

(51) Int. Cl.
| | |
|---|---|
| *H01J 37/34* | (2006.01) |
| *B65D 81/20* | (2006.01) |
| *B65B 31/04* | (2006.01) |
| *C23C 14/34* | (2006.01) |

(52) U.S. Cl.
CPC .......... *B65D 81/2007* (2013.01); *B65B 31/04* (2013.01); *B65D 81/2023* (2013.01); *C23C 14/3407* (2013.01); *H01J 37/3423* (2013.01)

(58) Field of Classification Search
None
See application file for complete search history.

(56) References Cited

U.S. PATENT DOCUMENTS

| 2002/0096430 A1* | 7/2002 | Lupton | ............... | H01J 37/3435 |
| | | | | 204/298.12 |
| 2007/0131545 A1* | 6/2007 | Okabe | .................. | H01J 37/342 |
| | | | | 204/298.12 |

FOREIGN PATENT DOCUMENTS

| CN | 102424134 A | 4/2012 |
|---|---|---|
| JP | 62-64712 A | 3/1987 |
| JP | 4-215951 A | 8/1992 |
| JP | 7-137715 A | 5/1995 |
| JP | 2001-72016 A | 3/2001 |
| JP | 2012-111994 A | 6/2012 |
| JP | 2017-179464 A | 10/2017 |
| JP | 2017-179607 A | 10/2017 |
| WO | WO 2005/037649 A1 | 4/2005 |

OTHER PUBLICATIONS

Japanese Office Action dated Mar. 26, 2019 for Application No. 2018-219946, along with an English translation.

(Continued)

*Primary Examiner* — Jason Berman
(74) *Attorney, Agent, or Firm* — Birch, Stewart, Kolasch & Birch, LLP (57) ABSTRACT

A sputtering target packaging structure comprising:
a sputtering target including a cylinder part, a flange part disposed on an opening part at one end of the cylinder part, and a cap disposed on an opening part at the other end of the cylinder part; and
a packing material made up of a sheet and covering an inner surface and an outer surface of the sputtering target in a close contact state, wherein
the packing material includes seal parts on both end sides of the sputtering target.

18 Claims, 4 Drawing Sheets

(56) References Cited

OTHER PUBLICATIONS

Japanese Office Action dated Nov. 5, 2019 for Application No. 2019-079318, along with an English translation.
Japnese Office Action dated Jul. 2, 2019 for Application No. 2019-079318, along with an English translation.

\* cited by examiner

SPUTTERING TARGET PACKAGING STRUCTURE AND METHOD OF PACKAGING SPUTTERING TARGET

CROSS REFERENCE TO RELATED APPLICATIONS

This application claims benefit of priority to Japanese Patent Application 2018-219946 filed Nov. 26, 2018, the entire content of which is incorporated herein by reference.

TECHNICAL FIELD

The present disclosure relates to a sputtering target packaging structure and a method of packaging a sputtering target.

BACKGROUND

A sputtering method is known as a method of forming an inorganic thin film. Regarding a sputtering target, sputtering apparatuses performing the sputtering method include an apparatus using a flat-plate sputtering target and an apparatus using a cylindrical sputtering target.

Between them, the sputtering apparatus using a cylindrical sputtering target is configured to cool a target material from inside the cylindrical sputtering target and perform sputtering while rotating the cylindrical sputtering target. Therefore, in the sputtering apparatus using a cylindrical sputtering target, a usage efficiency of the target material is 70% or more. This use efficiency is very high as compared to the sputtering apparatus using a flat-plate sputtering target and is useful from the viewpoint of saving resources and reducing the economic burden.

On the other hand, when the sputtering targets are shipped or stored, both the cylindrical sputtering target and the flat-plate sputtering target are usually put in resin bags, and subsequently, the inside thereof is vacuum-sucked, or an inert gas is introduced therein. This is performed for preventing adhesion of dust or deterioration (e.g., oxidation) of the sputtering target. In a sputtering target packing apparatus described in WO2005/037649, at the time of vacuum suction of a hollow cathode type sputtering target having, for example, a U-shaped cross section covered with a resin bag, a space part of the sputtering target is vacuum-degassed through a through-hole disposed in a lid covering the space part of the sputtering target so that even a packing resin does not touch the space part of the sputtering target.

SUMMARY

Problem to be Solved by the Disclosure

From the viewpoint of saving resources and reducing the economic burden as described above, use of a cylindrical sputtering target is increasingly attracting attention. Particularly, considering stable installation in a sputtering apparatus, recently widely used cylindrical sputtering targets have a flange part disposed around an opening part at one end and an opening part at the other end sealed with a cap etc.

However, the present inventors found that a cylindrical sputtering target including such a flange part and a cap may cause many problems during vacuum suction and packaging for shipping or storage. First, since the cylindrical sputtering target is generally elongated and has a large inner volume, one end sealed with a cap causes a problem of difficulty in bringing the inside of the sputtering target into a sufficiently vacuum state at the time of packing. Second, if the cylindrical sputtering target has a flange part, a packing material is caught on an edge portion of the flange part even when vacuuming is directly performed, causing a problem that air inside and outside the sputtering target cannot successfully be evacuated.

Figure 4:
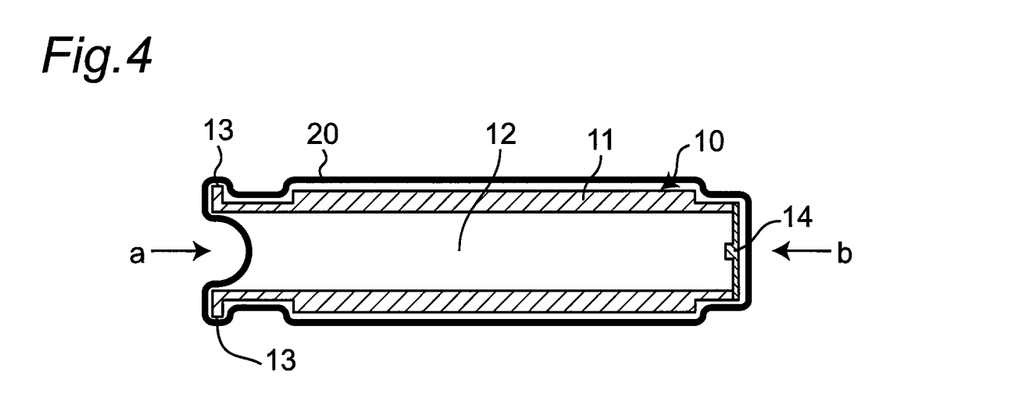
FIG. 4 is a schematic diagram showing a cross section of a cylindrical sputtering target brought into a vacuum-packed state by using a general method.

FIG. 4 is a schematic diagram showing a cross section of a cylindrical sputtering target brought into a vacuum-packed state by using a general method. As shown in FIG. 4, a cylindrical sputtering target 10 has a space 12 inside a cylinder part 11 with a flange part 13 disposed on an opening part at one end of the cylinder part 11 and a cap 14 disposed on an opening part at the other end of the cylinder part 11. After covering the cylindrical sputtering target 10 with the packing material 20 for packing, vacuuming is performed from a (or b) in FIG. 4, i.e., a position at which vacuuming is usually performed. However, as described above, since the cylindrical sputtering target 10 is generally elongated and has a large inner volume of the space 12 inside the cylinder part 11, and the packing material 20 is caught on a portion around the flange part 13, the air in the space 12 inside the cylinder part 11 is not successfully evacuated. In a state of packing by such a method, since the air remaining in the space 12 inside the cylinder part 11 gradually diffuses to the outside, and vacuum packing by the packing material 20 gradually loosens, the loosened packing material 20 and the cylindrical sputtering target 10 rub each other during transportation, so that the cylindrical sputtering target 10 may be scratched, or a surface of the cylindrical sputtering target 10 may be deteriorated (e.g., oxidized) by the air and moisture not completely evacuated.

An object of the present disclosure is to provide a packaging structure of a sputtering target and a method of packaging a sputtering target, capable of packaging a cylindrical sputtering target having a flange part at one end and the other end sealed in a sufficiently vacuum state on the outside and inside.

Solutions to the Problems

An embodiment of the present disclosure provides a sputtering target packaging structure comprising:

a sputtering target including a cylinder part, a flange part disposed on an opening part at one end of the cylinder part, and a cap disposed on an opening part at the other end of the cylinder part; and a packing material made up of a sheet and covering an inner surface and an outer surface of the sputtering target in a close contact state, wherein the packing material includes seal parts on both end sides of the sputtering target.

In an embodiment of the present disclosure, the seal parts may be located outside both ends of the sputtering target.

In an embodiment of the present disclosure, a vacuum state may be achieved between the packing material and the sputtering target.

In an embodiment of the present disclosure, a gap between the flange part of the sputtering target and the packing material of the packaging structure may be less than 10 mm after one week under atmospheric pressure at 20° C. from the time of packaging.

An embodiment of the present disclosure provides a sputtering target packaging structure comprising:

a sputtering target including a cylinder part, a flange part disposed on an opening part at one end of the cylinder part, and a cap disposed on an opening part at the other end of the cylinder part; and a packing material made up of a sheet, wherein a vacuum state is achieved between the sputtering target and the packing material and/or the sputtering target and the packing material are in a close contact state, and wherein a gap between the flange part of the sputtering target and the packing material is less than 10 mm after one week under atmospheric pressure at 20° C. from the time of packaging.

In an embodiment of the present disclosure, the packing material may have a characteristic of hardly allowing permeation of oxygen and water.

In an embodiment of the present disclosure, the sputtering target may have a length of 1000 mm or more and 5000 mm or less in a longitudinal direction.

An embodiment of the present disclosure provides a method of packaging a sputtering target including a cylinder part, a flange part disposed on an opening part at one end of the cylinder part, and a cap disposed on an opening part at the other end of the cylinder part with a packing material, comprising the steps of:

covering an outside of the sputtering target with the packing material made up of a tubular sheet including opening parts at one end and the other end such that the flange part side of the sputtering target faces toward the one end of the packing material;

closing the opening part at one end of the packing material;

pushing into the inside of the sputtering target the one end of the packing material having the opening part closed on the flange part side of the sputtering target;

performing vacuuming from the opening part at the other end of the packing material on the cap side of the sputtering target and closing the opening part at the other end; and opening a portion of the packing material on the flange part side of the sputtering target, performing vacuuming from an opening part in the portion, and closing the opening part in the portion.

An embodiment of the present disclosure provides a method of packaging a sputtering target including a cylinder part, a flange part disposed on an opening part at one end of the cylinder part, and a cap disposed on an opening part at the other end of the cylinder part with a packing material, comprising the steps of:

covering an outside of the sputtering target with the packing material made up of a bag-shaped sheet including a closing part at one end and an opening part at the other end such that the flange part side of the sputtering target faces toward the closing part of the packing material;

pushing into the inside of the sputtering target the one end of the closing part of the packing material on the flange part side of the sputtering target;

performing vacuuming from the opening part at the other end of the packing material on the cap side of the sputtering target and closing the opening part at the other end; and opening a portion of the packing material on the flange part side of the sputtering target, performing vacuuming from an opening part in the portion, and closing the opening part in the portion.

In an embodiment of the present disclosure, the step of pushing the packing material into the inside of the sputtering target may include pushing the packing material into the inside of the sputtering target while inserting a core into the inside of the sputtering target.

In an embodiment of the present disclosure, at least one of the vacuuming from the opening part at the other end and the vacuuming from the opening part in the portion may be performed with the core inserted inside the sputtering target, and the method may include extracting the core after the vacuuming.

An embodiment of the present disclosure provides a method of packaging a sputtering target including a cylinder part, a flange part disposed on an opening part at one end of the cylinder part, and a cap disposed on an opening part at the other end of the cylinder part with a packing material, comprising the steps of:

covering an outside of the sputtering target with the packing material made up of a bag-shaped sheet including an opening part at one end and a closing part at the other end such that the flange part side of the sputtering target faces toward the opening part of the packing material;

closing the opening part at one end of the packing material;

opening a portion of the closing part of the packing material on the cap side of the sputtering target;

opening a portion of the packing material on the flange part side of the sputtering target;

pushing into the inside of the sputtering target the one end of the packing material having the opening part closed on the flange part side of the sputtering target;

performing vacuuming from the opening part in the portion on the cap side and closing the opening part in the portion on the cap side; and performing vacuuming from the opening part in the portion on the flange part side and closing the opening part in the portion on the flange part side.

In an embodiment of the present disclosure, the step of pushing the packing material into the inside of the sputtering target may include pushing the packing material into the inside of the sputtering target while inserting a core into the inside of the sputtering target.

In an embodiment of the present disclosure, at least one of the vacuuming from the opening part in the portion on the cap side and the vacuuming from the opening part in the portion on the flange part side may be performed with the core inserted inside the sputtering target, and wherein the method may include extracting the core after the vacuuming.

In an embodiment of the present disclosure, the packing material may have a characteristic of hardly allowing permeation of oxygen and water.

In an embodiment of the present disclosure, the length of the packing material in the longitudinal direction may be twice or more the length of the sputtering target in the longitudinal direction.

In an embodiment of the present disclosure, the method may comprise sealing the packing material along the longitudinal direction of the packing material so as to reduce the inner diameter of the packing material after covering the outside of the sputtering target with the packing material.

Effect of the Disclosure

The packaging structure of a sputtering target and the method of packaging a sputtering target according to the present disclosure enable packaging of the cylindrical sputtering target having the flange part at one end and the other end sealed in a sufficiently vacuum state on the outside and inside.

DETAILED DESCRIPTION

Embodiments of the present disclosure will now be described in detail with reference to the drawings; however, the present disclosure is not limited to the embodiments.

FIGS. 1A to 1H are schematic diagrams showing respective steps of a method of packaging a cylindrical sputtering target according to an embodiment of the present disclosure. In FIGS. 1A to 1H, a cylindrical sputtering target 100 and a packing material 200 are shown as a cross section parallel to a central axis. Details of the steps will hereinafter be described with reference to FIGS. 1A to 1H.

Figure 1A:
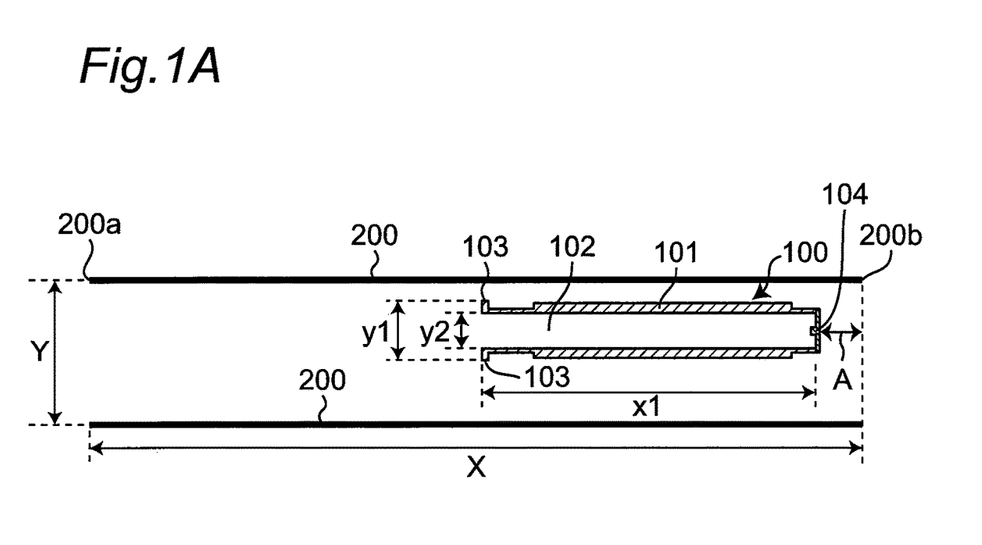
FIG. 1A is a schematic diagram showing a step of a method of packaging a cylindrical sputtering target according to an embodiment of the present disclosure.

First, as shown in FIG. 1A, the outside of the cylindrical sputtering target 100 is covered with the packing material 200 made up of a tubular sheet such that a flange part 103 side of the cylindrical sputtering target 100 faces toward one end of the packing material 200.

The cylindrical sputtering target 100 has a space 102 inside a cylinder part 101 with the flange part 103 disposed on an opening part at one end of the cylinder part 101 and a cap 14 disposed on an opening part at the other end of the cylinder part 101.

A material of the cylindrical sputtering target 100 is not particularly limited as long as the material is a target material usually used for film formation by sputtering. Examples of such a target material include Al, Cu, Cr, Fe, Ta, Ti, Zr, W, Mo, Nb, Ag, Co, Ru, Pt, Pd, Ni, and alloys containing these metals, tin-doped indium oxide (ITO), aluminum-doped zinc oxide (AZO), gallium-doped zinc oxide (GZO), titanium-doped zinc oxide, In—Ga—Zn-based composite oxide (IGZO), etc. Among them, aluminum (purity: 99.99% (4N) or more, preferably pure Al having a purity of 99.999% (5N) or more), aluminum alloy (examples of addition elements include Si, Cu, Nd, Mg, Fe, Ti, Mo, Ta, Nb, W, Ni, and Co, and preferably Si and Cu are included as additive elements. Al purity of a base material excluding the additive elements is 99.99% or more, preferably 99.999% or more), or copper (purity: 99.99% (4N) or more) is preferable. Regarding the material of the cylindrical sputtering target 100 as described above, a material of a main body portion of the cylindrical sputtering target 100 may be different from a material of portions of the flange part 103 and the cap 104.

A length x1 of the cylindrical sputtering target 100 in a longitudinal direction shown in FIG. 1A is 1000 mm or more and 5000 mm or less, preferably 1500 mm or more and 4500 mm or less, more preferably 2000 mm or more and 4000 mm or less, further preferably 2200 mm or more and 3500 mm or less, still further preferably 2500 mm or more and 3000 mm or less.

An outer diameter y1 of the cylindrical sputtering target 100 shown in FIG. 1A is 75 mm or more and 400 mm or less, preferably 100 mm or more and 350 mm or less, more preferably 120 mm or more and 300 mm or less, further preferably 140 mm or more and 250 mm or less, still further preferably 150 mm or more and 200 mm or less. An inner diameter y2 shown in FIG. 1A is 50 mm or more and 250 mm or less, preferably 70 mm or more and 200 mm or less, more preferably 80 mm or more and 180 mm or less, further preferably 100 mm or more and 160 mm or less, still further preferably 110 mm or more and 150 mm or less.

The cylindrical sputtering target 100 having the length x1 in the longitudinal direction, the outer diameter y1, and the inner diameter y2 designed to the sizes as described above is suitable for a cylindrical sputtering target used as a wiring material for a liquid crystal display (LCD) etc.

The cylindrical sputtering target 100 may be made up of a cylindrical sputtering target material and a cylindrical backing tube inserted inside the sputtering target material. The backing tube has a structure in which a flange part is disposed at one end and the other end is sealed.

The sheet of the packing material 200 may be made of any material as long as the cylindrical sputtering target 100 can be vacuum-packed. As used herein, terms "vacuum", "vacuum state", and "vacuum packing" refer to a substantial vacuum state (or vacuum packing) in which an inevitable minute amount of substance such as air may be contained, rather than a complete vacuum state (or vacuum packing) in which no air is contained. Specifically, when an object is covered with the packing material, and gas molecules are sucked out from the space in the packing material covering the object to perform vacuuming sufficiently by using a commercially available vacuuming apparatus (e.g., a vacuum degassing apparatus or a vacuum pump), it can be considered that a vacuum state is achieved between the packing material and the object. More specifically, a degree of vacuum may be equal to or less than a low vacuum (100 kPa) defined in JIS Z 8126-1:1999. The degree of vacuum (absolute pressure) is preferably 50 kPa or less, more preferably 20 kPa or less.

The sheet of the packing material 200 preferably has a characteristic of hardly allowing permeation of oxygen and water. Therefore, deterioration such as oxidation of the surface of the cylindrical sputtering target 100 can be suppressed. The characteristic of hardly allowing permeation of oxygen and water refers to a characteristic having an oxygen permeability of 100 cc/m$^2$ atm·day or less, preferably 80 cc/m$^2$ atm·day or less, more preferably 70 cc/m$^2$ atm·day or less, and a moisture permeability of 20 g/m$^2$·day or less, preferably 15 g/m$^2$·day or less, more preferably 10 g/m$^2$·day or less. The oxygen permeability and the moisture permeability refer to values measured by a measurement method conforming to JIS K 7126 and JIS K 7129.

For example, a specific material of the sheet may be a film made of resin. Examples of the resin include, but not limited to, polypropylene, polyethylene, nanocomposite coated polyethylene terephthalate, aluminum-deposited polyethylene terephthalate (PET) or cast polypropylene (CPP), silica- or alumina-deposited PET or biaxially oriented nylon (ONY), polyvinylidene chloride (PVDC), nylon, PVDC-coated biaxially oriented nylon (KON) or biaxially oriented polypropylene (KOP), PET, polyvinyl chloride (PVC), biaxially oriented polypropylene (OPP), high density polyethylene (HDPE), low density polyethylene (LDPE), ethylene/vinyl alcohol copolymer resin (EVOH), etc. A laminated film, a coextruded multilayer film, etc. of these resins may also be available. The packing material 200 is preferably a laminated film or multilayer film. Using a form of such film layers facilitates simultaneously achieving multiple functions such as a moisture-proof property, oxygen permeation resistance, heat resistance, heat sealability, mechanical strength, and flexibility.

Since the packing material 200 has a tubular shape, a first end part 200a (corresponding to one end of the packing material 200 in this description) and a second end part 200b (corresponding to the other end of the packing material 200 in this description) shown in FIG. 1A are opened. Such a structure may be formed by using any method known to those skilled in the art. For example, end parts of one sheet of resin film as described above may be overlapped and appropriately sealed (e.g., by heat welding or bonding) to form a tubular shape. Alternatively, a commercially available tubular resin film sheet may be cut as necessary and used as it is.

A length X of the packing material 200 shown in FIG. 1A in the longitudinal direction is preferably twice or more the length x1 of the cylindrical sputtering target 100 in the longitudinal direction. More preferably, the length is 2 times or more and 3 times or less, more preferably 2.1 times or more and 2.5 times or less, further preferably 2.1 times or more and 2.3 times or less. An inner diameter Y of the tubular packing material 200 shown in FIG. 1A is not particularly limited as long as the inner diameter is larger than the outer diameter y1 of the cylindrical sputtering target 100 described above. However, preferably, the inner diameter Y of the packing material 200 has a size not so small that the outside of the cylindrical sputtering target 100 becomes difficult to cover and not so large that the packing material excessively remains when the outside of the cylindrical sputtering target 100 is covered, in consideration of the outer diameter y1 of the cylindrical sputtering target 100.

By appropriately setting the length X and the inner diameter Y of the packing material 200 in this way, wasteful use of the packing material can be avoided when the packaging method of the present embodiment is implemented, whch leads to cost reduction. Specifically, X is preferably 2000 mm or more and 15000 mm or less, more preferably 3000 mm or more and 10,000 mm or less, further preferably 4000 mm or more and 8000 mm or less, still further preferably 5000 mm or more and 7000 mm or less.

The thickness of the packing material 200 is not particularly limited and may appropriately be adjusted to a thickness capable of protecting the cylindrical sputtering target 100 in a vacuum state in accordance with a type of the sheet used for the packing material 200. Preferably, the thickness of the packing material 200 is adjusted to a thickness capable of suppressing the moisture permeability and the oxygen permeability to the ranges as described above. For example, the thickness is 20 μm or more, preferably 30 μm or more and 500 μm or less, more preferably 40 μm or more and 200 μm or less, and further preferably 50 μm or more and 100 μm or less.

In the step described above, preferably, as shown in FIG. 1A, the cylindrical sputtering target 100 is covered with the packing material 200 on the outside such that a distance from an end of the cylindrical sputtering target 100 on the cap 104 side to the second end part 200b becomes shorter than a distance from an end of the cylindrical sputtering target 100 on the flange part 103 side to the first end part 200a. More preferably, the packing material 200 is placed such that the entire cylindrical sputtering target 100 is located between a middle position of a longitudinal axis of the packing material 200 and the second end part 200b of the packing material 200, and that the end of the cylindrical sputtering target 100 on the cap 104 side is located to face toward the second end part 200b of the packing material 200. Further preferably, when the cylindrical sputtering target 100 is covered with the packing material 200 and located as in the form described above, a distance A shown in FIG. 1A is a distance between the end of the cylindrical sputtering target 100 on the cap 104 side and the second end part 200b (between an end surface of the cylindrical sputtering target 100 on the cap 104 side (i.e., an end surface of the cap 104) and an intersection point of a line drawn in a perpendicular direction from the end surface of the cap 104 with the second end part 200b) is a distance greater than the outer radius of the end surface of the cylindrical sputtering target 100 on the cap 104 side. The ratio thereof (the distance A/the outer radius of the end surface of the cylindrical sputtering target 100 on the cap 104 side) is preferably 1.1 times or more, more preferably 1.5 times or more and 10 times or less, further preferably 1.8 times or more and 8 times or less, still further preferably 2 times or more and 5 times or less, particularly preferably 2.5 times or more and 4 times or less. Specifically, the distance is 50 mm or more and 1000 mm or less, preferably 100 mm or more and 500 mm or less, more preferably 150 mm or more and 400 mm or less, further preferably 200 mm or more and 300 mm or less. By covering the packing material 200 in this way, the packaging can easily be performed without an extra step performed later. Furthermore, the volume subjected to vacuuming can be reduced, and workability can be improved in a subsequent vacuuming step and seal part formation step on the cap 104 side.

Figure 1B:
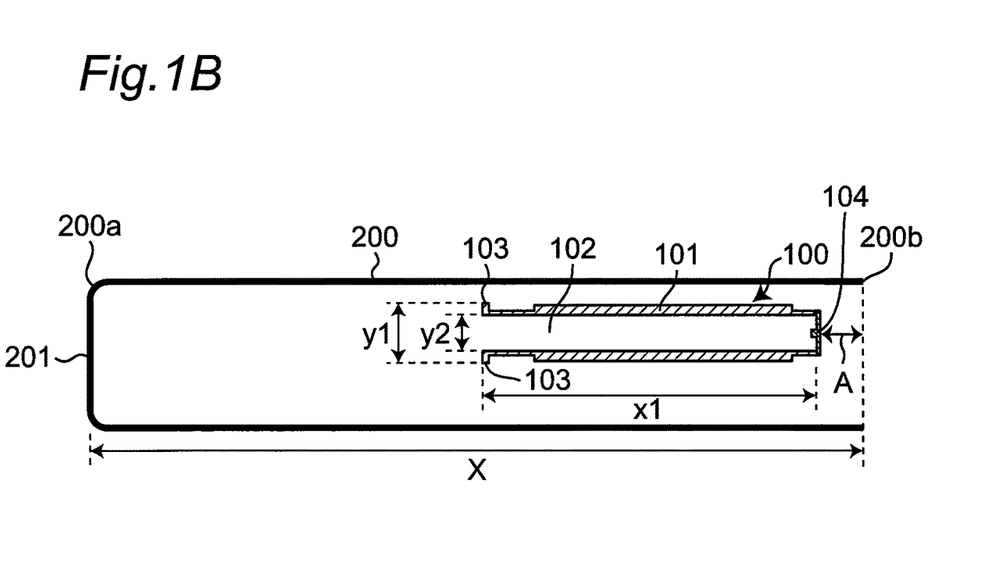
FIG. 1B is a schematic diagram showing a step of the method of packaging a cylindrical sputtering target according to the embodiment of the present disclosure.

Second, as shown in FIG. 1B, the opening part in the first end part 200a of the packing material 200 is closed to form a closing part 201. The closing part 201 may be formed by using any method known to those skilled in the art. For example, the closing part can be formed by heat welding, bonding, or sealing using a commercially available sealer (e.g., a long sealer).

Figure 1C:
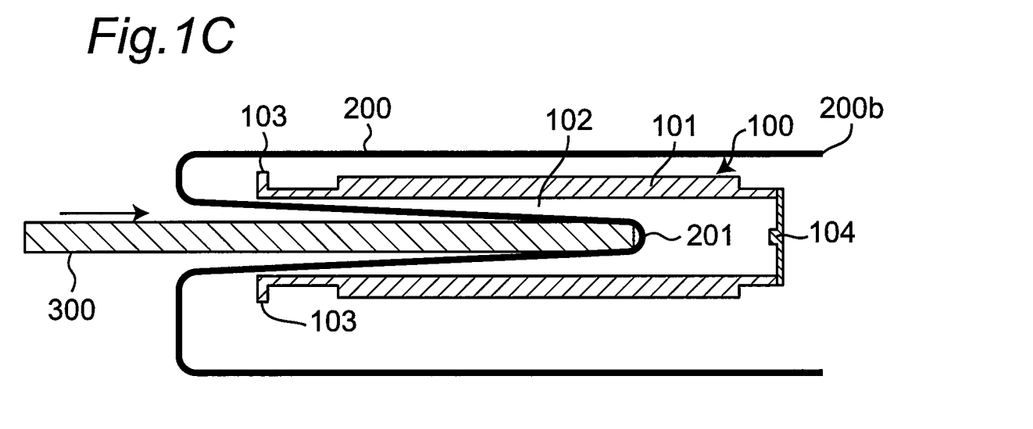
FIG. 1C is a schematic diagram showing a step of the method of packaging a cylindrical sputtering target according to the embodiment of the present disclosure.

Third, as shown in FIG. 1C, the first end part 200a having the closing part 201 of the packing material 200 on the flange part 103 side of the cylindrical sputtering target 100 is pushed inside the cylindrical sputtering target 100 while a core 300 is inserted inside the cylindrical sputtering target 100. By using the core 300 to push in the packing material 200 to an end inside the cylindrical sputtering target 100 in the direction of the cap 104, preferably until the closing part 201 thereof comes into contact with the cap 104, the packing material 200 can be inserted inside the cylindrical sputtering target 100 to reduce the inside air in advance. As a result, at the subsequent vacuuming step, the effect of packaging the cylindrical sputtering target 100 in a sufficiently vacuum state on the outside and inside according to the packaging method of the present disclosure can more suitably be exhibited. Particularly, by using the core 300 having an appropriate size matching the inner diameter y2 of the cylindrical sputtering target 100, the cylindrical sputtering target 100 can be packaged in a more closely contact state on the inside. A distance B between the end of the cylindrical sputtering target 100 on the flange part 103 side and a folded part of the packing material 200 on the flange part 103 side (an end surface of the cylindrical sputtering target 100 on the flange part 103 side (i.e., an end surface of the flange part 103) and a tip of the packing material 200 farthest from the end surface in a direction opposite to the direction of pushing the packing material 200 into the sputtering target 100 with the core 300) may be a distance greater than an outer radius of the end surface of the cylindrical sputtering target 100 on the flange part 103 side. The folded part of the packing material 200 on the flange part 103 side refers to a portion folded when the packing material 200 is inserted inside the cylindrical sputtering target 100 as shown in FIGS. 1F and 1G. The distance B is also shown in FIGS. 1F and 1G. The ratio thereof (the distance B/the outer radius of the end surface of the cylindrical sputtering target 100 on the flange part 103 side) is preferably 1.1 times or more, more preferably 1.5 times or more and 10 times or less, further preferably 1.8 times or more and 8 times or less, still further preferably 2 times or more and 5 times or less, and particularly preferably 2.5 times or more and 4 times or less. Specifically, the distance is 50 mm or more and 1000 mm or less, preferably 100 mm or more and 500 mm or less, more preferably 150 mm or more and 400 mm or less, further preferably 200 mm or more and 350 mm or less. By covering the packing material 200 in this way, the volume subjected to vacuuming can be reduced, and workability can be improved in the subsequent vacuuming step and seal part formation step on the flange part 103 side.

Figure 1D:
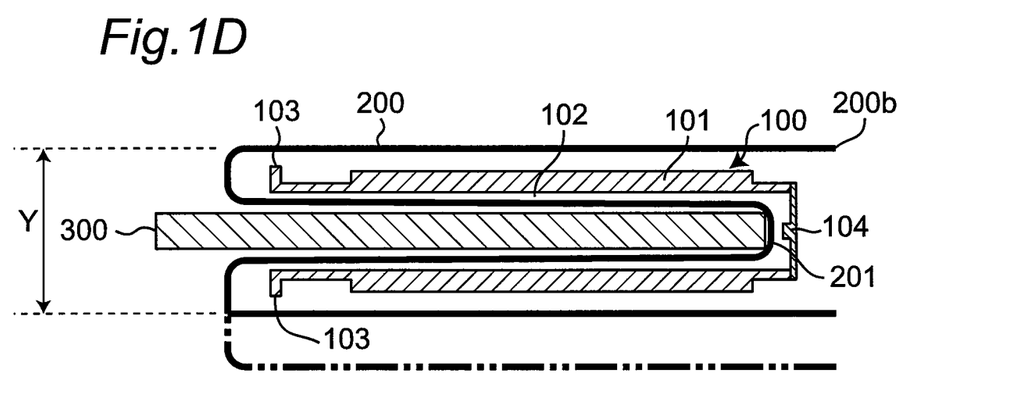
FIG. 1D is a schematic diagram showing a step of the method of packaging a cylindrical sputtering target according to the embodiment of the present disclosure.

Fourth, if the diameter of the packing material 200 is large as compared to the size of the cylindrical sputtering target 100, the packing material 200 may be sealed along the longitudinal direction of the packing material 200 so that the inner diameter Y of the packing material 200 is reduced as shown in FIG. 1D. Any sealing method known to those skilled in the art may be used. For example, the sealing can be achieved by heat welding or bonding using a commercially available sealer (e.g., a long sealer). As a result, the outside air can be reduced in advance, and at the subsequent vacuuming step, the effect of packaging the cylindrical sputtering target 100 in a sufficiently vacuum state on the outside and inside according to the packaging method of the present disclosure can more suitably be exhibited.

Figure 1E:
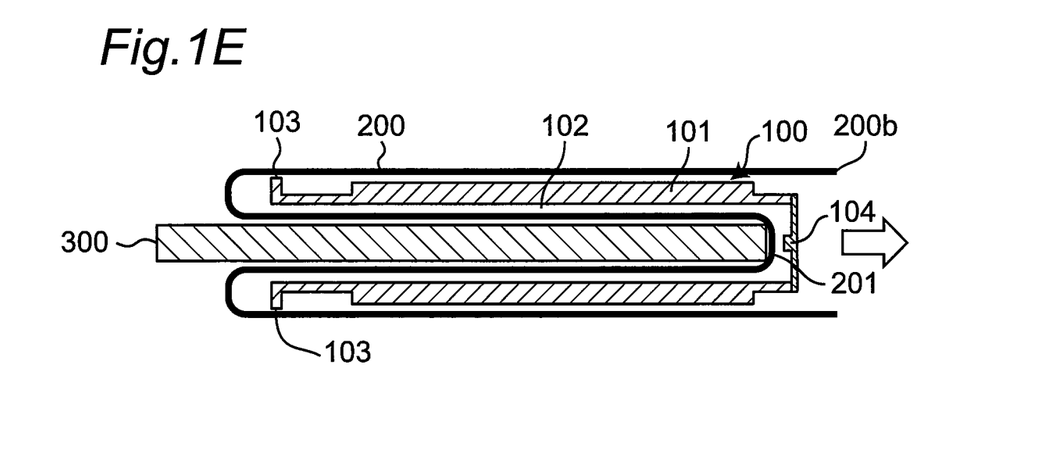
FIG. 1E is a schematic diagram showing a step of the method of packaging a cylindrical sputtering target according to the embodiment of the present disclosure.
Figure 1F:
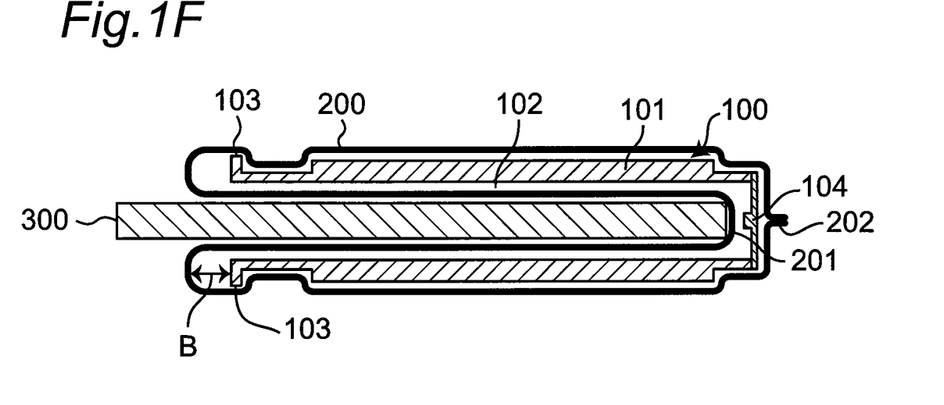
FIG. 1F is a schematic diagram showing a step of the method of packaging a cylindrical sputtering target according to the embodiment of the present disclosure.
Figure 1G:
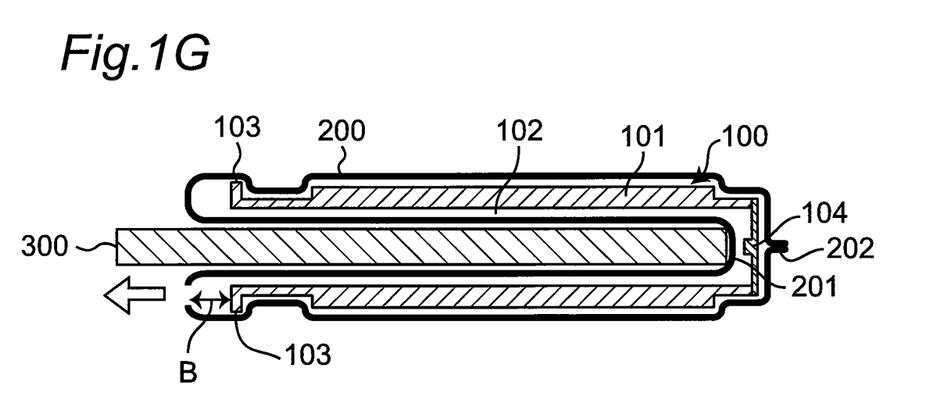
FIG. 1G is a schematic diagram showing a step of the method of packaging a cylindrical sputtering target according to the embodiment of the present disclosure.

Fifth, as indicated by an arrow of FIG. 1E, vacuuming is performed from the opening part at the second end part 200*b* of the packing material 200 on the cap 104 side of the cylindrical sputtering target 100. Preferably, sags and wrinkles of the packing material 200 are stretched before vacuuming. This can prevent air from being trapped between the cylindrical sputtering target 100 and the packing material 200.

Additionally, air may be trapped during vacuuming in a wrinkle portion, a stepped portion of the cylindrical sputtering target 100, etc. Therefore, the vacuuming is preferably performed while the trapped air is moved by hand toward the cap 104 side of the cylindrical sputtering target 100, for example. Subsequently, as shown in FIG. 1F, the opening part is closed to form a seal part 202. The seal part 202 is formed on the end side of the cylindrical sputtering target 100. At such a vacuuming step, the packing material 200 can be brought into close contact mainly on the outside of the cylindrical sputtering target 100 to achieve a vacuum state.

Any method known to those skilled in the art may be used for a method of vacuuming. For example, the method may include sufficiently sucking out gas molecules from a target space by using a commercially available vacuuming apparatus (e.g., a vacuum degassing apparatus or a vacuum pump). The seal part 202 may be formed by using any method known to those skilled in the art, as with the closing part 201 described above.

Sixth, as shown in FIG. 1G, an opening is formed in a portion of the packing material 200 on the end side of the flange part 103 of the cylindrical sputtering target 100, preferably in a portion of the packing material 200 on the outside of the end of the flange part 103 of the cylindrical sputtering target 100, and vacuuming is performed from an opening part in this portion as indicated by an arrow. The outside of the end of the flange part 103 of the cylindrical sputtering target 100 means the side opposite to the cylindrical sputtering target 100 with respect to the longitudinal direction of the cylinder from the end of the flange part 103 of the cylindrical sputtering target 100. At this vacuuming step, the packing material 200 can be brought into close contact to achieve a vacuum state mainly on the inside of the cylindrical sputtering target 100 without being caught on the flange part 103. Even during vacuuming from the flange part 103 side, air may be trapped in a wrinkle portion, a stepped portion of the cylindrical sputtering target 100, etc. Therefore, the vacuuming is preferably performed while the trapped air is moved by hand toward the flange part 103 side of the cylindrical sputtering target 100, for example.

Figure 1H:
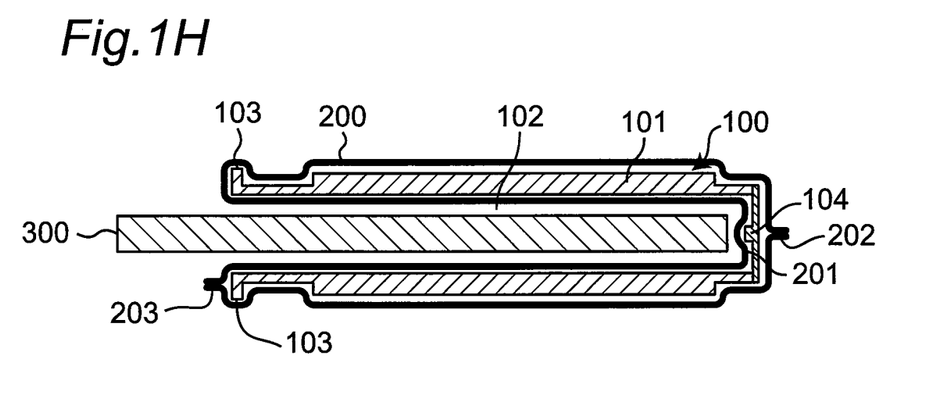
FIG. 1H is a schematic diagram showing a step of the method of packaging a cylindrical sputtering target according to the embodiment of the present disclosure.

Seventh, as shown in FIG. 1H, the opening part in this portion is closed to form a seal part 203. As with the seal part 202 described above, the seal part 203 is formed on the end side of the cylindrical sputtering target 100. the vacuuming method and the method of forming the seal part 203 may be any methods known to those skilled in the art as described above. In the present disclosure, since a material to be packaged is the cylindrical sputtering target 100 made of a relatively high-harness metal, alloy, or ceramic, the movement of the packing material 200 due to vacuuming does not cause deformation etc. of the material to be packaged. Therefore, if vacuuming is directly performed, the packing material is caught on an edge portion of the cylindrical sputtering target 100 so that air is highly likely to remain between the cylindrical sputtering target 100 and the packing material 200, particularly inside the cylindrical sputtering target 100. By vacuuming from both end sides of the cylindrical sputtering target 100 as in this embodiment, the cylindrical sputtering target 100 can be packaged in a sufficiently vacuum state on the outside and inside.

As shown in FIGS. 1E to 1H, after sufficiently performing the vacuuming etc., the core 300 is pulled out from the inside of the cylindrical sputtering target 100, and the packaging structure of the cylindrical sputtering target 100 is fabricated. By performing the vacuuming step on both sides with the core 300 inserted inside the cylindrical sputtering target 100 in this way, the packing material 200 can be prevented from moving during the vacuuming, and the packing material 200 can more easily brought into contact with the cylindrical sputtering target 100, so that the effect of packaging the sputtering target in a sufficiently vacuum state on the outside and inside according to the present disclosure can more suitably be exhibited.

In other embodiments, before packaging the cylindrical sputtering target 100 of FIGS. 1A to 1H of the embodiment described above, a protective film may be affixed to further partially or entirely cover the inside and outside of the cylindrical sputtering target 100. The protective film is not particularly limited as long as the film is a peelable film capable of protecting the surface of the cylindrical sputtering target 100. Examples of the protective film include polyester resin films such as polyethylene terephthalate, polybutylene terephthalate, and polyethylene naphthalate; polyolefin resin films such as polyethylene and polypropylene films; and acrylic resin films. The protective film is preferably selected from the group consisting of polyester resin films, polyolefin resin films, and acrylic resin films. By affixing the protective film, the cylindrical sputtering target 100, or particularly, a sputtering surface or a sealing surface serving as a mounting surface for a sputtering apparatus, can be prevented from being scratched during vacuuming.

In further embodiments, the flange part 103 and the cap 104 of the cylindrical sputtering target 100 are not limited to those having the shapes shown in FIG. 1 of the embodiment described above. For example, in FIGS. 1A to 1H of the embodiment described above, the flange part 103 is formed to have a convex portion toward the outside of the cylinder part 101. However, in another embodiment, the sputtering target may have a tubular shape without a convex portion on the outside and inside of the cylinder part 101. Furthermore, in another embodiment, the flange part 103 may be formed to have a convex portion toward the inside of the cylinder part 101 or both the outside and the inside of the cylinder part 101. It is noted that the effect of packaging the cylindrical sputtering target 100 in a sufficiently vacuum state on the outside and inside can more suitably produced in the case of the cylindrical sputtering target 100 provided with the flange part 103 having the convex portion on the outside of the cylinder part 101. In a further embodiment, for example, the cap 104 may disposed such that a convex portion or a concave portion is formed, although the cap 104 is disposed to extend along the longitudinal axis direction of the cylindrical sputtering target 100 at the end of the cylinder part 101 in the embodiment of FIGS. 1A to 1H.

The cylindrical sputtering target 100 shown in FIGS. 1A to 1H of the embodiment described above has a cylindrical shape; however, in other embodiments, the sputtering target may have any shape as long as the shape is a tubular shape applicable as a sputtering target. For example, the tubular shape includes not only a shape having a circular cross section perpendicular to the longitudinal axis but also those having an elliptical, square, or polygonal cross section. Therefore, the cylindrical shape includes not only a circular cylindrical shape but also a rectangular cylindrical shape.

Figure 2:
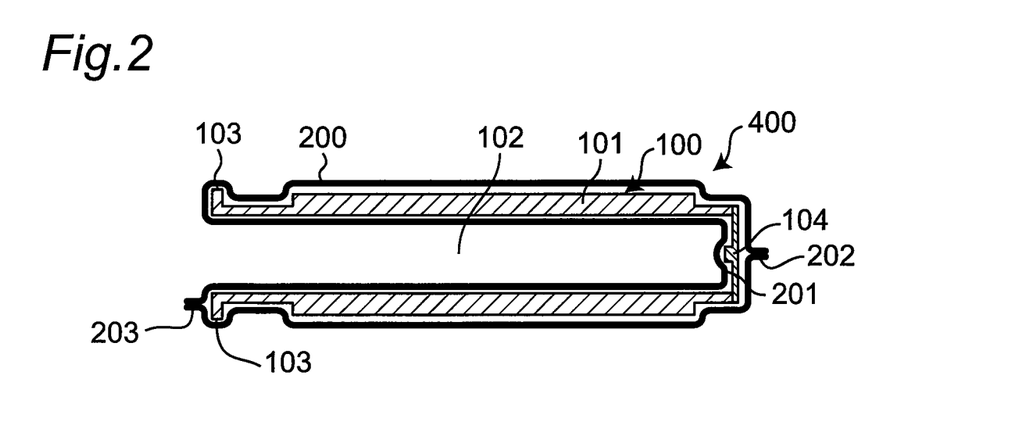
FIG. 2 is a cross-sectional diagram showing a packaging structure of a cylindrical sputtering target packaged by the method of FIGS. 1A to 1H.

In another embodiment, the step of covering the outside of the cylindrical sputtering target 100 with the packing material 200 shown in FIG. 1A of the embodiment described above and the step of forming the closing part 201 by closing the opening part at one end of the packing material 200 shown in FIG. 2 may be performed in reverse order.

In other embodiments, in FIGS. 1A and 1B of the embodiment described above, instead of the tubular packing material 200 with both end parts (the first end part 200a and the second end part 200b) opened, a bag-shaped sheet having a closing part at one end (corresponding to the first end part 200a side) and an opening part at the other end (corresponding to the second end part 200b side) or having an opening part at one end (corresponding to the first end part 200a side) and a closing part at the other end (corresponding to the second end part 200b side) may be used for covering the outside of the cylindrical sputtering target 100.

In an embodiment in this case, the outside of the cylindrical sputtering target 100 is covered with the packing material 200 such that the flange part 103 side faces toward the originally formed closing part of the packing material 200. Therefore, in this embodiment, the step of forming the closing part 201 in the packing material 200 in FIG. 1B of the embodiment described above is not necessary.

Alternatively, in another embodiment in this case, the outside of the cylindrical sputtering target 100 is covered with the packing material 200 such that the flange part 103 side faces toward the opening part of the packing material 200. Therefore, in this embodiment, the opening part of the packing material 200 on the flange part 103 side is closed, and one end of the closed packing material 200 is pushed into the cylindrical sputtering target 100. At the time of vacuuming on the cap 104 side, a portion of the originally formed closing part of the packing material 200 is opened before vacuuming from the portion, which is followed by closing of the opening part in the portion of the packing material 200 on the cap 104 side. The originally formed closing part of the packing material 200 on the cap 104 side is opened before or when the packing material 200 is pushed into the cylindrical sputtering target 100. By opening the closing part of the packing material 200 on the cap 104 side either before or when the material is pushed, air can be released from the opening part, and the packing material 200 can sufficiently be pushed in. With this step, the packing material 200 can be brought into close contact mainly on the outside of the cylindrical sputtering target 100 to achieve a vacuum state. In another embodiment, a portion of the closed part on the cap 104 side is not opened, and before or when one end of the closed packing material 200 is pushed into the cylindrical sputtering target 100, a portion of the packing material 200 on the flange part 103 side (a portion not inserted inside the cylindrical sputtering target 100) is opened. By opening a portion of the packing material 200 on the flange part 103 side either before or when the material is pushed, air can be released from the opening part in the portion, and the packing material 200 can sufficiently be pushed in. After the packing material 200 is pushed in, vacuuming performed from of the opening part in the portion on the flange part 103 side is followed by closing of the opening part in the portion of the packing material 200 on the flange part 103 side, and subsequently, a portion of the closing part on the cap 104 side is opened before vacuuming from the portion, which is followed by closing of the opening part in the portion of the packing material 200 on the cap 104 side.

In the case of the embodiment, by performing at least one, preferably both, of the vacuuming from the opening in the portion on the cap 104 side and the vacuuming from the opening in the portion on the flange part 103 side (the portion not inserted inside the cylindrical sputtering target 100) are performed with the core 300 inserted inside, and extracting the core 300 after the vacuuming, the packing material 200 can be prevented from moving during the vacuuming, so that the packing material 200 is more easily bought into contact with the cylindrical sputtering target 100, which enables the packaging of the cylindrical sputtering target 100 in a sufficient vacuum state.

In FIG. 1C of the embodiment described above, the packing material 200 is pushed inside the cylindrical sputtering target 100 by using the core 300; however, in further embodiments, any method known to those skilled in the art may be used as long as one end of the packing material 200 can be pushed inside the cylindrical sputtering target 100. For example, high-pressure air or various gases may be blown, or the cylindrical sputtering target 100 is disposed with the flange part 103 side facing upward, and a weight may be placed with the packing material 200 interposed inside the cylindrical sputtering target 100 and may be dropped to push one end of the packing material 200 inside the cylindrical target 100.

In other embodiments, if the size of the inner diameter Y of the packing material 200 is set to an appropriate size matching the outer diameter y1 of the cylindrical sputtering target 100 as described above, the step of FIG. 1D of the embodiment described above may not be performed.

In further embodiments, the step of FIG. 1D of the embodiment described above may be performed at any stage of the packaging steps. For example, the packing material 200 may be sealed so that the packing material 200 has an appropriate size before covering the cylindrical sputtering target 100, or may be sealed at a stage immediately after the outside of the cylindrical sputtering target 100 is covered with the packing material 200 in FIG. 1A of the embodiment described above or before one end of the packing material 200 is pushed inside the cylindrical sputtering target 100. From the viewpoints of improvement in workability when the cylindrical sputtering target 100 is covered with the packing material 200, the effect of preventing the cylindrical sputtering target 100 from being scratched due to rubbing against the packing material 200, and the effect of reducing the outside air in advance to facilitate packaging of the cylindrical sputtering target 100 in a sufficient vacuum state on the outside and inside, preferably, the step of FIG. 1D of the embodiment described above is performed after the step of covering the cylindrical sputtering target 100 with the packing material 200 and before the steps of vacuuming.

In another embodiment, the steps of vacuuming and formation of the seal part 202 on the cap 104 side shown in FIGS. 1E and 1F and the steps of opening of a portion, vacuuming, and formation of the seal part 203 on the flange part 103 side shown in FIGS. 1G and 1H of the embodiment described above may be performed in reverse order. However, from the viewpoint of the effect of facilitating packaging of the cylindrical sputtering target 100 in a sufficiently vacuum state on the inside, preferably, the vacuuming and formation of the seal part 202 on the cap 104 side are performed first as in the embodiment described above so as to form a close contact state before the vacuuming of the inside of the cylindrical sputtering target 100 (vacuuming on the flange part 103 side).

The core 300 is extracted after vacuuming is performed twice in the embodiment described above; however, in other embodiments, the timing of extraction of the core 300 from the inside of the cylindrical sputtering target 100 is not particularly limited as long as the timing is after the closing part 201 of the packing material 200 is pushed into the cylindrical sputtering target 100. The core 300 may be extracted at any stage immediately after the packing material 200 is pushed inside the cylindrical sputtering target 100 in FIG. 1C of the embodiment described above, after the packing material 200 is sealed along the longitudinal direction of the packing material 200 in FIG. 1D, and after the vacuuming and formation of the seal part 202 on the cap 104 side are performed in FIGS. 1E and 1F.

According to the packaging method according to the present disclosure described above, after the packing material 200 is pushed inside the sputtering target from the flange part 103 side of the cylindrical sputtering target 100, the vacuuming is performed twice from both end sides on the flange part 103 side and the cap 104 side of the sputtering target, the packing material 200 is not caught on the flange part 103, and the cylindrical sputtering target 100 including the cap 104 is brought into a sufficiently vacuum state even on the inside so that the packing material 200 can be brought into close contact with the inner wall surface of the cylindrical sputtering target 100.

FIG. 2 is a cross-sectional diagram showing a packaging structure of a cylindrical sputtering target packaged by the method of FIGS. 1A to 1H.

As shown in FIG. 2, a cylindrical sputtering target packaging structure 400 includes the cylindrical sputtering target 100 and the packing material 200. As described above, the cylindrical sputtering target 100 has the space 102 inside the cylinder part 101 with the flange part 103 disposed on the opening part at one end of the cylinder part 101 and the cap 14 disposed on the opening part at the other end of the cylinder part 101. The packing material 200 covers the inner surface and outer surface, preferably substantially the entire inner surface and substantially the entire outer surface, of the cylindrical sputtering target 100 in a close contact state and includes the seal part 202 (on the cap 104 side) and the seal part 203 (on the flange part 103 side) on both end sides of the cylindrical sputtering target 100. Preferably, a vacuum state is achieved between the packing material 200 and the cylindrical sputtering target 100. The meaning of the vacuum state is as described above.

In the present specification, "close contact" or "close contact state" does not necessarily means that objects are completely in tight contact with each other without a gap and may be achieved via the protective film described above. In this description, the "close contact" or "close contact state" refers to a state in which an object is wrapped by a packing material in a sufficiently vacuum state on the inside and outside by applying the packaging method described above so that the packing material is roughly in tight contact along a contour shape of the object.

Figure 3:
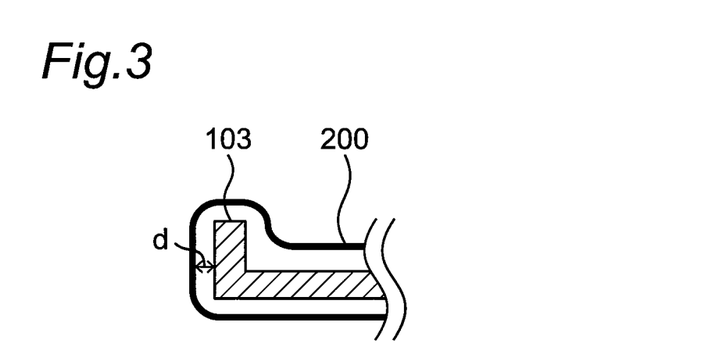
FIG. 3 is an enlarged cross-sectional diagram of a periphery of a flange part of FIG. 2.

Specifically, regarding the cylindrical sputtering target packaging structure 400, a gap d between the flange part 103 of the cylindrical sputtering target 100 and the packing material 200 shown in an enlarged diagram of FIG. 3 after one week under atmospheric pressure at 20° C. from the time of packaging is preferably less than 10 mm, more preferably 0.01 mm or more and 9 mm or less, further preferably 0.02 mm or more and 8 mm or less, still further preferably 0.03 mm or more and 5 mm or less, particularly preferably 0.05 mm or more and 2 mm or less. When the gap d is not more than the upper limit, the cylindrical sputtering target 100 can be prevented from being scratched due to rubbing with the packing material 200 caused by loosening of the vacuum packing, and the surface of the cylindrical sputtering target 100 can be prevented from being deteriorated (e.g., oxidized) by the air and moisture not completely evacuated. When the gap d is not less than the lower limit, the packing material 200 can be prevented from being broken particularly near the edge portion of the cylindrical sputtering target 100 immediately after vacuuming. The gap d is defined as a farthest distance (excluding a stepped portion and a wrinkle portion of the packing material 200) in terms of the distance between the cylindrical sputtering target 100 and the packing material 200 when the packing material 200 is pulled in a direction perpendicular to a surface of the cylindrical sputtering target 100 with a force of 20N. For ease of measurement, the measurement is preferably performed by pulling an extra portion of the packing material 200 outside either the seal part 202 on the flange part 103 side or the seal part 203 on the cap 104 side. For pulling with a constant load, a device capable of measuring a pulling force such as a spring scale or a tension gauge is preferably used. Specifically, for example, a hole is made in an extra portion of the remaining packing material 200 with a punch or a needle, and a measuring device is hooked in the hole to measure the gap d while being pulled with a constant load. The gap d can be measured by using a ruler or a caliper, for example. When the gap d is small, for example, the gap can be obtained from an enlarged photograph obtained by photographing the flange part.

In the vacuum packing state of the cylindrical sputtering target 10 shown in FIG. 4, the large volume of the space 12 results in a negative pressure in the inside of the cylindrical sputtering target 10 after vacuuming, which may cause a phenomenon in which a portion of the packing material 20 is drawn inside from the flange part 13 side of the cylindrical sputtering target 10. However, in the cylindrical sputtering target packaging structure 400 obtained by the packaging method according to the present disclosure, the packing material 200 covers the inner surface of the cylindrical sputtering target 100 in a close contact state, and therefore, this phenomenon does not occur. The cylindrical sputtering target packaging structure 400 can prevent the packing material 200 from being damaged due to rubbing of the packing material 200 against, for example, an edge portion such as a corner and a step of the flange part 103 when the packing material 200 is pulled inside the cylindrical sputtering target 100.

As described above, the seal part 202 on the cap 104 side and the seal part 203 on the flange part 103 side are formed by putting two layers of the packing material 200 together and then performing heat welding, bonding, or sealing by using a commercially available sealer (e.g., a long sealer) after vacuuming for the respective parts.

The seal part 202 and the seal part 203 are located on both end sides of the cylindrical sputtering target 100, preferably on the outside of both ends of the cylindrical sputtering target 100. The both end sides of the cylindrical sputtering target 100 mean both end sides (the flange part 103 side and the cap 104 side) of the long axis of the cylindrical sputtering target 100. The outside of both ends of the cylindrical sputtering target 100 means the sides opposite to both ends of the cylindrical sputtering target 100 with respect to a longitudinal direction of the cylinder from both ends (the flange part 103 and the cap 104) of the long axis of the cylindrical sputtering target 100. In other words, this means that the distance between the seal part 202 and the seal part 203 in the packaged state is greater than the length of the cylindrical sputtering target 100.

The distance from the end surface of the cylindrical sputtering target 100 on the cap 104 side to the seal part 202 (the distance to an intersection point of a line drawn in a perpendicular direction from the end surface of the cylindrical sputtering target 100 on the cap 104 side with the seal part 202) and the distance from the end surface of the cylindrical sputtering target 100 on the flange part 103 side to the seal part 203 (the distance to an intersection point of a line drawn in a perpendicular direction from the end surface of the cylindrical sputtering target 100 on the flange part 103 side with the seal part 203) may be a distance greater than the outer radius of the end surface of the cylindrical sputtering target 100 on the cap 104 side. The ratio to the outer radius is preferably 1.1 times or more, more preferably 1.2 times or more and 7 times or less, further preferably 1.3 times or more and 5 times or less, still further preferably 1.4 times or more and 3 times or less, particularly preferably 1.5 times or more and 2.5 times or less. Specifically, the distance is 45 mm or more and 750 mm or less, preferably 80 mm or more and 450 mm or less, more preferably 100 mm or more and 300 mm or less, further preferably 120 mm or more and 250 mm or less. Disposing the seal part at this position leads to favorable workability for the seal part formation after vacuuming and can ensure a space for disposing an opening part for performing vacuuming again. By ensuring such a space, vacuuming can repeatedly be performed for those having an inadequate vacuum state and those having a vacuum state loosened due to long-term storage.

By locating the seal part 202 and the seal part 203 formed after vacuuming for the respective parts on both end sides, preferably on the outside of both ends, of the cylindrical sputtering target 100, a degree of adhesion of the packing material 200 to the outside and inside of the sputtering target can be increased, and the influence of being caught on the flange part 103 is also suitably improved. Furthermore, this enables storage etc. without loosening of the packing material 200 for a longer period.

Alternatively, the cylindrical sputtering target packaging structure 400 includes the cylindrical sputtering target 100 and the packing material 200 such that a vacuum state is achieved between the cylindrical sputtering target 100 and the packing material 200 and/or the cylindrical sputtering target 100 and the packing material 200 are in a close contact state, and the gap d between the flange part 103 of the cylindrical sputtering target 100 and the packing material 200 is less than 10 mm after one week under atmospheric pressure at 20° C. from the time of packaging. The meanings of the vacuum state and the close contact state are as described above.

The outside of the cylindrical sputtering target packaging structure 400 may further be covered with the packing material 200 so as to prevent the packing material 200 covering the cylindrical sputtering target 100 from being broken due to an external force during transportation, or to maintain the periphery of the cylindrical sputtering target 100 in a vacuum state even if the packing material 200 is broken. Such a layer structure may have three or more multiple layers. In this case, a space between the layers is preferably brought into a vacuum state by vacuuming. The packing material 200 may be the same or different in each layer. Packaging of second and following layers of the packing material 200 may be applied by the same method as the first layer, or the packaging may be applied such that the packing material 200 is in close contact only with the outside of the cylindrical sputtering target 100 since the cylindrical sputtering target 100 is packaged in a sufficient vacuum state by the packing material 200 of the first layer.

Examples and comparative examples of the present disclosure will hereinafter be described. The following examples and comparative examples of the present disclosure are merely illustrative and do not limit the present disclosure.

EXAMPLES

Example 1

A cylindrical sputtering target (2950 mm long) prepared had a cylindrical part with a length of 2750 mm, an outer diameter of 165 mm, and an inner diameter of 126 mm and included a flange part at an opening part at one end of the cylinder part and a cap at the other end. A cylinder part main body of the cylindrical sputtering target was made of high purity (99.999%) aluminum, the flange part and the cap were made of an aluminum alloy, and the outer radii of end surfaces on the cap side and the flange side were 70 mm and 82.5 mm, respectively. The surface of the cylindrical part of the cylindrical sputtering target was protected with a protective film ("Mitsui Masking Tape" (registered trademark) manufactured by Mitsui Chemicals Tohcello Inc.). The cylindrical sputtering target was put into and covered with a tubular packing material (S-WRAP AL manufactured by Star Plastic Industry Inc. (oxygen permeability: 60 cc/m$^2$ atm·day, moisture permeability: 9 g/m$^2$·day)) cut to a longitudinal length of about 6400 mm. In this case, the cylindrical sputtering target was arranged such that the end on the cap side thereof was at a position of about 250 mm from the end of the packing material of about 6400 mm. Subsequently, one end of the packing material on the flange part side of the cylindrical sputtering target was sealed, and the one end was pushed in by using a core until reaching an end of a space inside the cylindrical sputtering target in the cap direction.

After removing sags of the packing material in a pushed-in state, vacuuming was performed for 30 seconds by using a long sealer with vacuum pump degassing capability (LOS-1000-NT1 manufactured by Fuji Impulse Co., Ltd.) from an opening part of the packing material on the cap side of the cylindrical sputtering target while trapped air was moved by hand toward the cap side of the cylindrical sputtering target, which was followed by sealing of the opening part. Subsequently, a portion of the end of the packing material on the flange side of the cylindrical sputtering target was cut, and vacuuming was performed for 120 seconds by using the same apparatus, which was followed by sealing of the opening part. In this case, the packing material was also in close contact with the end surface on the cap side such that portions of the packing materials were in close contact with each other at the center of the cap, and the seal part on the cap side was at a position of about 150 mm from the end surface of the cylindrical sputtering target on the cap side. The packing material was also in close contact with the end surface of the flange part, and the seal part on the flange part side was at a position of about 150 mm from the end surface of the cylindrical sputtering target on the flange part side. After complete sealing, the core was extracted to fabricate a cylindrical sputtering target packaging structure. Except a step portion of the cylindrical sputtering target and a wrinkle portion of the packing material, the packing material was in close contact with substantially the entire outer surface and the entire inner surface of the cylindrical sputtering target.

Example 2

A cylindrical sputtering target packaging structure was fabricated by the same method as Example 1 described above except that a cylindrical sputtering target having a cylinder part main body made of high purity (99.99%) oxygen-free copper and a flange part and a cap made of oxygen-free copper was used as a cylindrical sputtering target to be packaged.

Comparative Example

The same cylindrical sputtering target as in Example 1 described above was prepared, and the surface was protected with a protective film ("Mitsui Masking Tape" (registered trademark) manufactured by Mitsui Chemicals Tohcello Inc.). The cylindrical sputtering target was put into and covered with a tubular packing material (S-WRAP AL manufactured by Starplastic Industry Inc. (oxygen permeability: 60 cc/m$^2$ atm·day, moisture permeability: 9 g/m$^2$·day)) cut to a longitudinal length of about 3450 mm. In this case, the cylindrical sputtering target was arranged such that the end on the cap side thereof was at a position of about 250 mm from the end of the packing material of about 3450 mm. Subsequently, the opening part of the packing material on the cap side of the cylindrical sputtering target was sealed by using a long sealer with vacuum pump degassing capability (LOS-1000-NT1 manufactured by Fuji Impulse Co., Ltd.). In this case, vacuuming was not performed. Subsequently, vacuuming was performed for 120 seconds by using the same apparatus from the opening part of the packing material on the flange side of the cylindrical sputtering target while trapped air was moved by hand toward the flange part side of the cylindrical sputtering target, which was followed by sealing of the opening part of the packing material on the flange side to fabricate a cylindrical sputtering target packaging structure. The sealing was performed such that the seal part on the cap side was at a position of about 150 mm from the end surface of the cylindrical sputtering target on the cap side while the seal part on the flange side was at a position of about 150 mm from the end surface of the cylindrical sputtering target on the flange part side; however, after completion of packaging, the seal part on the flange side was slightly drawn inside the cylindrical sputtering target as shown in FIG. 4.

(Evaluation)

The cylindrical sputtering targets packaging structures of Example 1, Example 2, and Comparative Example were stored at 20° C. under atmospheric pressure for one week. For each of the cylindrical sputtering target packaging structures after storage, a digital force gauge (DSV-200N manufactured by IMADA Co., Ltd.) provided with a hook part was attached to a 6 mm hole punched in the packing material outside the seal part on the flange part side and was pulled with a force of 20N outward in the longitudinal direction of the cylindrical sputtering target (in a direction substantially perpendicular to the end surface on the flange part side). A gap generated between the packing material and the end surface of the cylindrical sputtering target on the flange side was measured with a ruler. As a result of measurement at five positions for each of the packaging structures, the maximum gap was 1 mm or less in each of the cylindrical sputtering targets of Examples 1 and 2. On the other hand, the maximum gap was 10 mm in the packaging structure of Comparative Example. It is noted that when the same evaluation was performed immediately after vacuum packing for the cylindrical sputtering target packaging structure of Example 1, Example 2, and Comparative Example, the gap between the cylindrical sputtering target and the packing material was 1 mm or less.

As described above, in the cylindrical sputtering target packaging structures of Examples 1 and 2, the packing material for packaging the cylindrical sputtering target was not loosened even after one week from the time of packaging. In contrast, in the cylindrical sputtering target packaging structure of Comparative Example, the packing material for packaging the cylindrical sputtering target was loosened after one week from the time of packaging. From this result, it can be understood that by pushing one end of the packing material into the inside of the cylindrical sputtering target and then performing vacuuming twice from both the flange part side and the cap side of the cylindrical sputtering target, even an elongated cylindrical sputtering target having a flange part and a cap at both ends can be packaged in a sufficiently vacuum state on the outside and inside thereof.

INDUSTRIAL APPLICABILITY

According to the method of packaging a sputtering target of the present disclosure, a packing material is not caught on a flange part of an elongated cylindrical sputtering target having one end provided with the flange part and the other end sealed with a cap etc., and the sputtering target can be packaged in a sufficiently vacuum state on the outside and inside thereof.

EXPLANATIONS OF LETTERS OR NUMERALS 10, 100 cylindrical sputtering target
11, 101 cylinder part
12, 102 space
13, 103 flange part
14, 104 cap
20, 200 packing material
200a first end part
200b second end part
201 closing part
202, 203 seal part
300 core
400 cylindrical sputtering target packaging structure

The invention claimed is:

1. A sputtering target packaging structure comprising:
a sputtering target including a cylinder part, a flange part disposed on an opening part at one end of the cylinder part, and a cap disposed on an opening part at the other end of the cylinder part; and
a packing material made up of a sheet and covering an inner surface and an outer surface of the sputtering target in a close contact state, wherein
the packing material includes seal parts on both end sides of the sputtering target.

2. The sputtering target packaging structure according to claim 1, wherein the seal parts are located outside both ends of the sputtering target.

3. The sputtering target packaging structure according to claim 1, wherein a vacuum state is achieved between the packing material and the sputtering target.

4. The sputtering target packaging structure according to claim 1, wherein a gap between the flange part of the sputtering target and the packing material of the packaging structure is less than 10 mm after one week under atmospheric pressure at 20° C. from the time of packaging.

5. A sputtering target packaging structure comprising:
a sputtering target including a cylinder part, a flange part disposed on an opening part at one end of the cylinder part, and a cap disposed on an opening part at the other end of the cylinder part; and
a packing material made up of a sheet, wherein
a vacuum state is achieved between the sputtering target and the packing material and/or the sputtering target and the packing material are in a close contact state, and wherein
a gap between the flange part of the cylindrical sputtering target and the packing material is less than 10 mm after one week under atmospheric pressure at 20° C. from the time of packaging when the packing material is pulled outward in a longitudinal direction of the cylindrical sputtering target with a force of 20N.

6. The sputtering target packaging structure according to claim 1, wherein the packing material has a characteristic of hardly allowing permeation of oxygen and water.

7. The sputtering target packaging structure according to claim 1, wherein the sputtering target has a length of 1000 mm or more and 5000 mm or less in a longitudinal direction.

8. A method of packaging a sputtering target including a cylinder part, a flange part disposed on an opening part at one end of the cylinder part, and a cap disposed on an opening part at the other end of the cylinder part with a packing material, comprising the steps of:
covering an outside of the sputtering target with the packing material made up of a tubular sheet including opening parts at one end and the other end such that the flange part side of the sputtering target faces toward the one end of the packing material;
closing the opening part at one end of the packing material;
pushing into the inside of the sputtering target the one end of the packing material having the opening part closed on the flange part side of the sputtering target;
performing vacuuming from the opening part at the other end of the packing material on the cap side of the sputtering target and closing the opening part at the other end; and
opening a portion of the packing material on the flange part side of the sputtering target, performing vacuuming from an opening part in the portion, and closing the opening part in the portion.

9. A method of packaging a sputtering target including a cylinder part, a flange part disposed on an opening part at one end of the cylinder part, and a cap disposed on an opening part at the other end of the cylinder part with a packing material, comprising the steps of:
covering an outside of the sputtering target with the packing material made up of a bag-shaped sheet including a closing part at one end and an opening part at the other end such that the flange part side of the sputtering target faces toward the closing part of the packing material;
pushing into the inside of the sputtering target the one end of the closing part of the packing material on the flange part side of the sputtering target;
performing vacuuming from the opening part at the other end of the packing material on the cap side of the sputtering target and closing the opening part at the other end; and
opening a portion of the packing material on the flange part side of the sputtering target, performing vacuuming from an opening part in the portion, and closing the opening part in the portion.

10. The method of packaging a sputtering target according to claim 8, wherein the step of pushing the packing material into the inside of the sputtering target includes pushing the packing material into the inside of the sputtering target while inserting a core into the inside of the sputtering target.

11. The method of packaging a sputtering target according to claim 10, wherein at least one of the vacuuming from the opening part at the other end and the vacuuming from the opening part in the portion is performed with the core inserted inside the sputtering target, and wherein the method includes extracting the core after the vacuuming.

12. A method of packaging a sputtering target including a cylinder part, a flange part disposed on an opening part at one end of the cylinder part, and a cap disposed on an opening part at the other end of the cylinder part with a packing material, comprising the steps of:
covering an outside of the sputtering target with the packing material made up of a bag-shaped sheet including an opening part at one end and a closing part at the other end such that the flange part side of the sputtering target faces toward the opening part of the packing material;
closing the opening part at one end of the packing material;

opening a portion of the closing part of the packing material on the cap side of the sputtering target;

opening a portion of the packing material on the flange part side of the sputtering target;

pushing into the inside of the sputtering target the one end of the packing material having the opening part closed on the flange part side of the sputtering target;

performing vacuuming from the opening part in the portion on the cap side and closing the opening part in the portion on the cap side; and performing vacuuming from the opening part in the portion on the flange part side and closing the opening part in the portion on the flange part side.

13. The method of packaging a sputtering target according to claim 12, wherein the step of pushing the packing material into the inside of the sputtering target includes pushing the packing material into the inside of the sputtering target while inserting a core into the inside of the sputtering target.

14. The method of packaging a sputtering target according to claim 13, wherein at least one of the vacuuming from the opening part in the portion on the cap side and the vacuuming from the opening part in the portion on the flange part side is performed with the core inserted inside the sputtering target, and wherein the method includes extracting the core after the vacuuming.

15. The method of packaging a sputtering target according to claim 8, wherein the packing material has a characteristic of hardly allowing permeation of oxygen and water.

16. The method of packaging a sputtering target according to claim 8, wherein the length of the packing material in the longitudinal direction is twice or more the length of the sputtering target in the longitudinal direction.

17. The method of packaging a sputtering target according to claim 8, comprising sealing the packing material along the longitudinal direction of the packing material so as to reduce the inner diameter of the packing material after covering the outside of the sputtering target with the packing material.

18. The sputtering target packaging structure according to claim 5, wherein the sputtering target has a length of 1000 mm or more and 5000 mm or less in a longitudinal direction.

\* \* \* \* \*